United States Patent [19]

Chu

[11] 4,072,937
[45] Feb. 7, 1978

[54] MOS TRANSISTOR DRIVER CIRCUITS FOR PLASMA PANELS AND SIMILAR MATRIX DISPLAY DEVICES

[75] Inventor: William Wing-Yen Chu, Matawan, N.J.

[73] Assignee: Bell Telephone Laboratories, Incorporated, Murray Hill, N.J.

[21] Appl. No.: 649,239

[22] Filed: Jan. 15, 1976

[51] Int. Cl.$^2$ ............................................. G06F 3/14
[52] U.S. Cl. ........................ 340/324 M; 315/169 TV; 340/343
[58] Field of Search ............ 340/324 M, 173 PL, 343; 315/169 TV, 169 R

[56] References Cited

U.S. PATENT DOCUMENTS

| | | | |
|---|---|---|---|
| 3,754,230 | 8/1973 | Auger | 340/324 M |
| 3,883,775 | 5/1975 | Aling | 315/169 R |
| 3,913,090 | 10/1975 | Fischer | 340/324 M |
| 3,925,690 | 12/1975 | Spence | 340/324 M |

*Primary Examiner*—Marshall M. Curtis

*Attorney, Agent, or Firm*—Ronald D. Slusky

[57] ABSTRACT

Driver circuits for plasma panels and similar matrix display devices are disclosed. Each driver circuit includes a single MOS transistor for coupling sustain signals to an associated row or column conductor of the panel. The drain of the transistor is connected to the associated conductor. For a first polarity of sustain signal, the transistor is operated in a conventional manner. For the second polarity of sustain signal, the transistor is operated in an unconventional manner in which the junction between the drain and the semiconductor layer in which the transistor is disposed is forward-biased. The second polarity of sustain signal is thereby extended through the transistor by way of a forward-biased diode path rather than by way of its channel. Write and erase signal waveforms are continuously applied to each driver circuit. Additional MOS circuitry in each driver circuit is responsive to an applied address signal to couple the write and erase signals through to the associated conductor.

10 Claims, 5 Drawing Figures

MOS TRANSISTOR DRIVER CIRCUITS FOR PLASMA PANELS AND SIMILAR MATRIX DISPLAY DEVICES

BACKGROUND OF THE INVENTION

The present invention relates to driver circuits for plasma panels and similar matrix display devices. The invention more particularly pertains to circuitry for coupling sustain, write and erase signals to the row and column conductors defining the crosspoint cells of such display devices.

Plasma panels and similar matrix display devices comprise a coordinate array of crosspoint display cells defined by mutually orthogonal sets of row and column conductors. A selected cell is switched into an on or off (light-emitting or non-light-emitting, energized or non-energized) state via the application of specially-adapted write and erase voltages to the cell in question. Alternating polarity "sustain" voltages of magnitude $V_s$ are impressed across each cell to maintain cells which are in the on state in that state. These sustain signals do not affect the states of cells which are off, however.

Sustain, write and erase voltages are impressed across a given cell of the display device, or panel, by coupling them to the row conductor and column conductor which define the cell. Driver circuits or more simply, drivers, each connected to an associated row or column conductor are provided for this purpose. The driver circuits must be able to conduct sustain signal current both to and from the associated conductor and must be able to handle relatively large signals with little voltage loss. Desirably, driver circuits for these panels should also be readily amenable to inexpensive integrated circuit fabrication.

SUMMARY OF THE INVENTION

A driver circuit fulfilling these and other criteria in accordance with the present invention utilizes a metal oxide semiconductor (MOS) transistor to couple sustain signals to the associated row or column conductor. The drain of the sustain transistor is connected to the associated conductor.

A first polarity of sustain signal is impressed across a cell defined by particular row and column conductors by applying a first potential to the source of the sustain transistor of the associated column driver. The gate potential of the column driver sustain transistor is such that the first potential at its source forward biases the transistor, rendering its channel conductive and extending the first potential to the associated column conductor.

In accordance with a feature of the invention, the sustain transistor of the row driver associated with the row conductor of interest is operated in an unorthodox manner at this time. A second potential, differing from the first by $V_s$, is applied to the semiconductor layer in which the row driver sustain transistor is disposed. The relative polarity of the first and second potentials is such as to forward bias the junction between the drain of the row driver sustain transistor and the layer in which that transistor is disposed. With this unconventional arrangement, the transistor does not operate in a conventional manner. Rather, the second potential is extended to the row conductor via an effective forward-biased diode path, advantageously minimizing the loss of sustain potential in the driver circuit.

The other polarity of sustain signal is impressed across the cell by applying the first potential to the source of the row driver sustain transistor and the second potential to the semiconductor layer in which the column driver sustain transistor is disposed, thereby reversing the operative roles of the row and column driver sustain transistors as described above. The source of each sustain transistor can be interconnected with the semiconductor layer in which that transistor is disposed without affecting the above-described sustain operation. This advantageously allows both the first and second potentials to be applied to a given driver on the same lead.

Conventionally, the state of a selected cell of a matrix display panel is changed by applying half-magnitude, or "half-select," write and erase signals to the row and column conductors defining that cell. The signals applied to the row and column conductors are of opposite polarity. Illustratively, the half-select signals are continuously applied to each driver, and write/erase circuitry therein is operative in response to an address signal to couple the signals through to the associated conductor. Depending on circuit parameters, either the row or column half-select signals are capable of inducing the above-discussed diode action in the associated sustain transistor during non-sustain periods, disadvantageously shunting those signals.

In accordance with a further feature of the invention, however, this undesired diode action is prevented by varying the potential at the sustain transistor semiconductor layer (and thus, illustratively, at its source) by an amount corresponding to the write or erase half-select signal magnitude. However, the write and erase signals thus applied to the source of the sustain transistor are capable of operating it in the same manner as sustain signals do, thereby undesirably coupling write and erase signals to the associated conductor even in the absence of an address signal. In accordance with the invention, this problem is overcome by maintaining the gate of the sustain transistor at a reverse-biasing potential during at least write and erase periods.

BRIEF DESCRIPTION OF THE DRAWING

The invention may be clearly understood from a consideration of the following detailed description and accompanying drawing in which.

DETAILED DESCRIPTION

Figure 1:
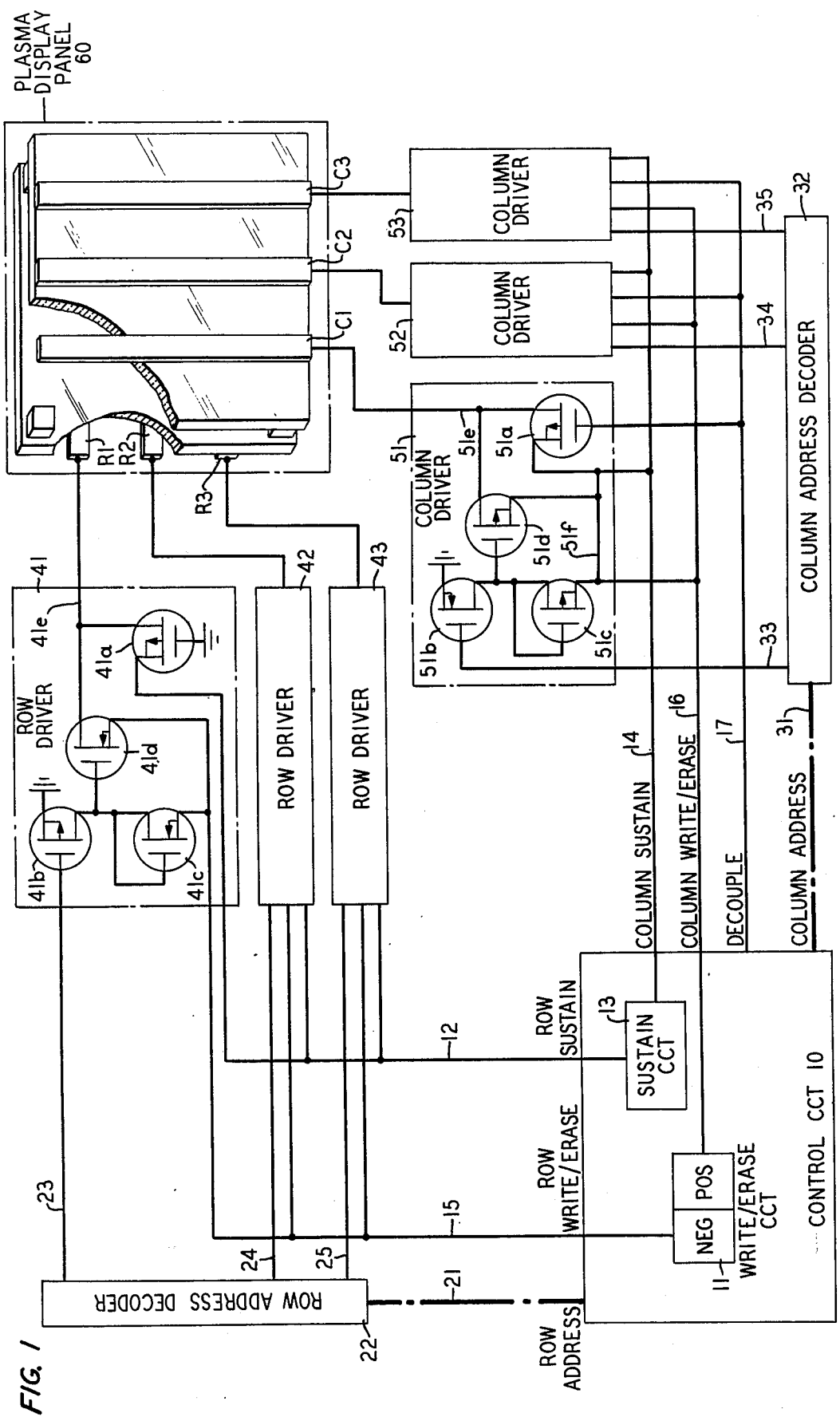
FIG. 1 depicts a display system including driver circuitry embodying the principles of the present invention.

The heart of the display system of FIG. 1 is a matrix display device, illustratively a plasma display panel 60. Panel 60 has a coordinate array of crosspoint display cells defined by row coordinate conductors R1 through R3 and column coordinate conductors C1 through C3 disposed on respective dielectric material substrates. The dielectric material substrates are spaced apart and gaseous display material, such as neon, is disposed therebetween.

Images or other graphic data are displayed on a plasma panel by utilizing the mechanism of electrical discharge breakdown of the gaseous display material at selected crosspoint display cells. When a voltage at least as great as a predetermined breakdown voltage $V_b$ is applied across a display cell, the gas in the crosspoint region breaks down and provides a light-emitting discharge of low current density. The magnitude of $V_b$ is determined by the pressure-distance characteristic of the particular gaseous display material employed and may be on the order of 200 volts. As the breakdown discharge and the resultant current flow are established initially at a crosspoint display cell, charge is stored on the dielectric material surfaces of the display cell in the immediate vicinity of the crosspoint. The stored charge opposes the voltage applied to the display cell and quickly reaches a level where the voltage across the cell becomes too low to maintain the discharge, thereby quenching the discharge at the crosspoint.

Panel 60 is operated by control circuit 10. In particular, sustain circuit 13 thereof impresses alternating-polarity sustain signals, illustratively in the form of rectangular pulses, across each cell of panel 60 via row driver circuits, or drivers, 41, 42 and 43 and column driver circuits, or drivers, 51, 52 and 53. These sustain pulses function to maintain on cells of panel 60 in that state, as is discussed hereinbelow. Row drivers 41-43, associated with row conductors R1-R3, respectively, receive sustain signals on row sustain lead 12. Column drivers 51-53, associated with column conductors C1-C3, respectively, receive sustain signals on column sustain lead 14.

Figure 2:
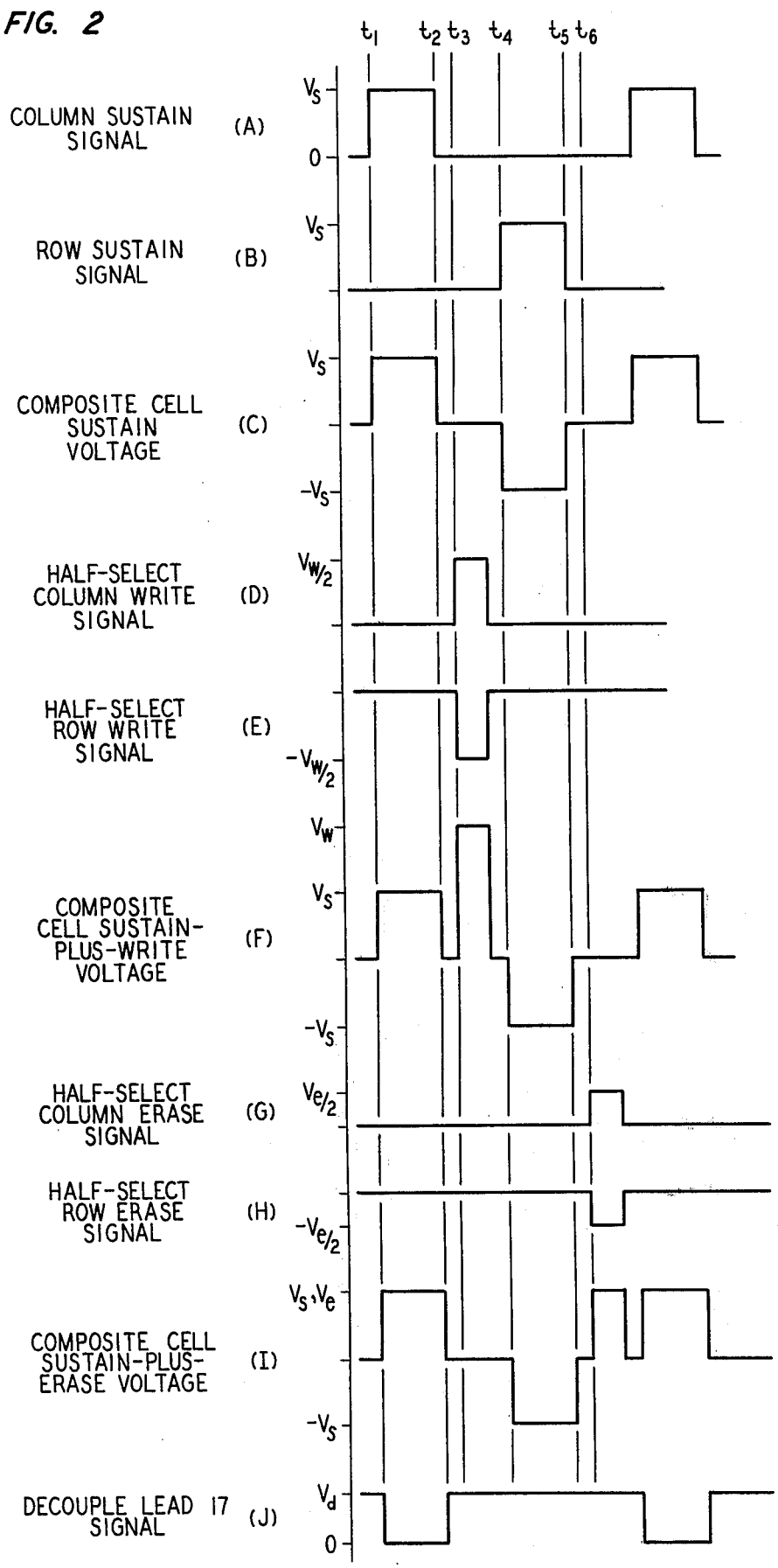
FIG. 2 depicts signal waveforms helpful in understanding the operation of the system of FIG. 1.

More particularly, as indicated in FIG. 2, circuit 13 impresses a positive (column conductor to row conductor) sustain pulse across each cell by extending a first, positive signal at a potential $V_s$ to each column conductor via its respective driver from time $t_1$ to time $t_2$, while extending ground potential to each row conductor via its respective driver. The magnitude of $V_s$ may be on the order of 100 volts. A negative sustain pulse is thereafter impressed across each cell from time $t_4$ to time $t_5$ by reversing the potentials applied to the row and column drivers. This two-pulse sustain cycle then repeats. Waveforms (A) and (B) in FIG. 2 show the signals applied to the column and row conductors, respectively. Waveform (C) thereof shows the composite sustain voltage impressed across each crosspoint display cell.

Control circuit 10 energizes a selected crosspoint cell of panel 60 by applying a so-called write pulse thereto beginning at a time $t_3$ of a selected sustain cycle. The magnitude $V_w$ of the write pulse, which may be on the order of 200 volts, as well as its polarity, duration and placement with respect to the following sustain pulse are such as to effect momentary breakdown of the gaseous display material at the addressed cell. Current flows thereacross and a level of charge is stored on the adjacent dielectric material surfaces. The stored charge level is determined principally by the net voltage across the cell and, for the present illustrative embodiment, is on the order of 100 volts, i.e. half the breakdown voltage $V_b$. During succeeding half cycles of the sustain voltage, the charge stored on the dielectric material surfaces of previously-energized display cells combines additively with the sustain signal voltage thereacross to cause periodic breakdown of the gas at such cells, and hence periodic light emissions therefrom. The sustain signal frequency may be on the order of 50 kHz so that even though the light emissions are in the form of discrete light pulses, on cells appear to be continuously energized. Since the sustain signal magnitude $V_s$ is substantially less than the breakdown voltage $V_b$, the sustain signals do not affect the states of off cells or cause them to emit light.

Control circuit 10 de-energizes a previously energized display cell by applying a so-called erase pulse thereto beginning at a time $t_6$ of a selected sustain cycle. The magnitude $V_e$ of the erase pulse, which may be on the order of 100 volts, as well as its polarity, duration and placement with respect to the following sustain pulse are such as to remove, or erase, the charge stored at that cell. Thus, no further discharge occurs at that cell in response to subsequent sustain pulses until another write pulse is applied thereto.

Write and erase pulses are impressed across a selected cell by applying a selection signal of half the write or erase pulse magnitude as the case may be, to the row conductor defining that cell, and a selection signal of half the write or erase signal magnitude to the column conductor defining that cell. As illustrated in FIG. 2 by waveforms (D) and (E) for the write pulse and by waveforms (G) and (H) for the erase pulse, these selection or so-called "half-select" signals have opposing polarities so that their magnitudes combine additively at the selected cell. The half-select row and column signals are, of course, applied to all the cells of the row and column, respectively, in which the selected cell lies. The half-select signals have no affect on the states of those other cells, however, since the magnitude of one half-select signal is insufficient without the other to cause a gas breakdown.

The composite sustain-plus-write voltage across a cell to which coincident half-select write signals have been applied is shown as waveform (F) in FIG. 2. As is conventional, the write pulse is of the same polarity as the sustain pulse initiated immediately before it. The composite sustain-plus-erase voltage across a cell to which coincident half-select erase signals have been applied is shown as waveform (I) in FIG. 2. As is conventional, the erase pulse is of the opposite polarity as the sustain pulse initiated immediately before it.

The negative polarity half-select write and erase signals of waveforms (E) and (H) are applied to each of row drivers 41, 42 and 43 in each sustain cycle by write/erase circuit 11 of control circuit 10 via row write/erase lead 15. Circuit 11 similarly applies the positive half-select write and erase signals of waveforms (D) and (G) to each of column drivers 51, 52 and 53 in each sustain cycle via column write/erase lead 16. When it is desired to write or erase a particular cell, control circuit 10 operating, for example, under the control of a digital computer, extends a row address code word to row address decoder 22 via cable 21, thereby identifying the row in which the cell is located. Decoder 22 extends a signal to the appropriate row driver via one of leads 23, 24 and 25. That driver, in turn, couples the negative selection signal then on lead 15 to its associated row conductor. At the same time, control circuit 10 extends a column address code word to column address decoder 32 via cable 31, thereby identifying the column in which the selected cell is located. Decoder 32 extends a signal to the appropriate column driver via one of leads 33, 34 and 35. That driver, in turn, couples the positive selection signal then on lead 16 to its associated column conductor. It will be appreciated that control circuit 10 will extend row and column address code words to decoders 22 and 32 at times determined by whether it is desired to write or erase the cell in question.

The present invention is directed to the structure of drivers 41–43 and 51–53. Drivers 41–43 are illustratively identical to one another. Hence, by way of example, only the structure of driver 41 is shown. Drivers 51–53 are illustratively identical to one another. Hence, by way of example, only the structure of driver 51 is shown. Drivers 41–43 and 51–53 are similar, although not identical, to each other as is discussed hereinbelow.

The column sustain signals on lead 14 are received in driver 51 by p-channel metal oxide semiconductor, or pMOS, transistor 51a. The gate potential of transistor 51a is controlled by control circuit 10 via decouple lead 17 and it may be assumed for the present that decouple lead 17 is maintained at ground potential. The drain of transistor 51a is connected to conductor C1 via lead 51e.

In operation, the $V_s$ sustain signal of waveform (A) in FIG. 2 is applied to the source of transistor 51a beginning at time $t_1$ from lead 14. A forward-biasing potential of magnitude $V_s$ is thus established between the gate and source of transistor 51a. A conductive path is thereby established between the source and drain of that transistor via its channel and the potential $V_s$ is extended to column conductor C1. Stray and inherent capacitances, for example, prevent the drain potential of transistor 51a from rising as fast as its source potential in response to the sustain signal on lead 14. Thus, a large voltage initially appears across transistor 51a. This advantageously further enhances the conductivity of transistor 51a during the incipiency of the sustain signal. Still, a small voltage drop remains across transistor 51a due to the fact that its conductivity decreases with lower drain-to-source potential. This drop, which may be on the order of 10 volts (and thereafter decreasing slowly to a very low value), can be compensated for by increasing the voltage output of sustain circuit 13 by a like amount.

The row sustain signals on lead 12 are received in driver 41 by p-channel metal oxide semiconductor, or pMOS, transistor 41a. The drain of transistor 41a is connected to conductor R1 via lead 41e and its gate is held at ground potential. Beginning at time $t_1$, it is necessary for transistor 41a to provide a high-conductivity path from row conductor R1 to lead 12 to maintain conductor R1 at ground potential (waveform B).

Assume that transistor 41a provides this path from its drain to its source via its channel in conventional manner. High, or channel, conductivity could be achieved for transistor 41a by, for example, changing its gate potential from ground to a large negative voltage, thereby providing a large forward gate-source bias. However even though, as previously discussed, a sustain voltage drop across transistor 51a can be tolerated and compensated form, it is desirable to avoid a similar drop across transistor 41a if at all possible. Moreover, no initial large voltage difference is established across transistor 41a. Thus, the above-described conductivity enhancement does not occur. The sustain voltage loss across transistor 41a would thus be even greater than that across transistor 51a during the incipiency of the sustain pulse — its most critical part.

Higher channel conductivity could be provided for transistor 41a by making it physically large, for example. This is an undesirable solution, however, since it would increase the bulk and expense of driver 41. Alternatively, a high conductivity channel could be assured by utilizing so-called double-diffused MOS, or D/MOS, transistors such as are disclosed in "Double Diffused MOSFET Transistor Achieves Microwave Gain," *Electronics*, February 15, 1971, pages 99–104. However, D/MOS transistors could not withstand large negative write and erase voltages which, as will become evident, appear on lead 41e, and thus across transistor 41a.

The present invention provides an advantageous solution to the problem of establishing a high conductivity path from the drain of transistor 41a to lead 12 during this portion of the sustain cycle. As and aid to understanding the invention, reference is now made to FIG. 3, which shows a cross-sectional view of a portion of an MOS integrated circuit chip 100 on which driver 41 is illustratively fabricated. Drivers 42 and 43 may also be fabricated on this same chip. More particularly, chip 100 includes $\pi$-type substrate 101 on which an $n^-$-type epitaxial layer 102 has been grown. $P^+$-type isolation diffusion regions 103 divide epitaxial layer 102 into isolated regions such as regions 105 and 106. Transistor 41a includes p-type source and drain regions 110 and 111 disposed in region 106. Chip 100 is covered by a passivating layer 113. A gate conductor 117 is formed on top of passivating layer 113 above channel region 119 of layer 106. Channel region 119 lies between source and channel regions 110 and 111, respectively. Lead 41e is connected to drain region 111 via metallic conductor 116 and an opening in passivating layer 113.

Figure 3:
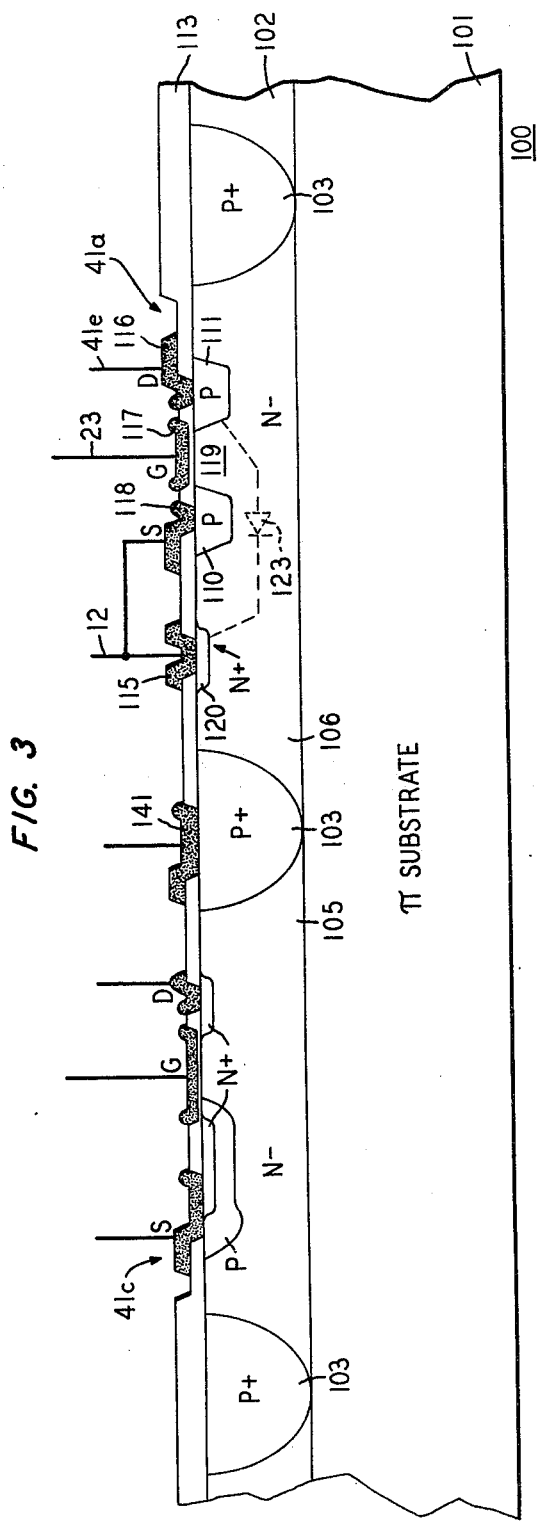
FIG. 3 depicts a cross-sectional view of a portion of an integrated MOS driver circuit embodying the principles of the invention.

In accordance with a feature of the invention, lead 12 is connected to region 106, illustratively via an opening in passivating layer 113, metallic conductor 115 and $n^+$-type region 120 disposed in region 106. Drain region 111 is more positive than layer 106 from time $t_1$ to time $t_2$. Thus during this interval an effective forward-biased p-n diode connection is established between p-type drain region 111 and $n^+$-type region 120. Advantageously, this effective diode connection, shown in phantom at 123 in FIG. 3, provides a very high-conductivity path from drain region 111, and thus conductor R1, to lead 12. At most, a voltage of only 0.7 volts or so can develop across this diode. Thus, advantageously, very little sustain voltage is lost thereacross. It will be noted that at this time, transistor 41a is not operating as a transistor since, unconventionally, the junction between region 106, on the one hand, and source and drain regions 110 and 111, on the other hand, are forward biased. In fact, source and channel regions 110 and 119 are effectively bypassed and do not play a significant part in the circuit operation.

The structure of transistor 51a, although not specifically shown in the drawing, is illustratively similar to that of transistor 41a. In fact, drivers 51–53 may be disposed on a single monolithic chip similar to chip 100. When the second, negative, polarity of sustain voltage is to be impressed across the cell defined by conductors R1 and C1 from time $t_4$ to time $t_5$, the roles of transistors 41a and 51a as described above are interchanged; the $V_s$ pulse is applied to the source of transistor 41a and ground potential is applied to the semiconductor layer in which transistor 51a is disposed.

With respect to transistor 41a, lead 12 may, advantageously, be connected not only to layer 106, as previously indicated, but also to source region 110, illustratively via metallic conductor 118. The junctions between layer 106, on the one hand, and source and drain regions 110 and 111 on the other hand, are now zero- or reverse-biased and transistor 41a operates in a normal mode, the same mode in which transistor 51a previously operated. Similarly, the source of transistor 51a may be interconnected with the layer in which that transistor is disposed. This interconnection provides conductor-to-sustain-lead diode action for transistor 51a from time $t_4$ to time $t_5$, without affecting its previously described operation between time $t_1$ and time $t_2$.

As indicated above, a further function of driver 41 is to couple the negative selection, i.e. half-select, write and erase signals of waveforms (E) and (H) respectively, to row conductor R1. Illustratively, write/erase circuitry in driver 41 for providing this function includes pMOS transistor 41b and nMOS transistors 41c and 41d. Although transistor 41b is not specifically shown in FIG. 3, its structure is illustratively the same as that of transistor 41a. In fact, transistor 41b may be disposed in region 106 behind (in the FIG. 3 view) transistor 41a. Transistors 41c and 41d may be, for example, double-diffused MOS, or D/MOS, transistors. One of these, transistor 41c, is shown in FIG. 3 as being disposed in region 105. The structure and operation of D/MOS transistors is well-known and need not be discussed in further detail herein.

Referring back to the circuit diagram of driver 41 in FIG. 1, it will be noticed that the gate of transistor 41a is connected to its drain so that transistor 41c functions as a resistor. When a cell defined by row conductor R1 is to be addressed with a write or erase signal, row address decoder 22 extends a forward-biasing signal to the gate of transistor 41b via lead 23. Transistor 41b thus provides a path for the write or erase signal on lead 15 through transistor 41c to ground. The voltage developed across transistor 41c in response to the current flowing therethrough forward-biases transistor 41d. The latter is rendered conductive and extends the write or erase signal on lead 15 through to row conductor R1 via lead 41e. The gate and source of transistor 41a are both at ground at this time. Thus, the channel of transistor 41a is nonconductive. Moreover, there is no forward-biased diode action in transistor 41a at this time since the write and erase signals on lead 41e have negative polarity. Thus transistor 41a has no effect on write and erase signals appearing at its drain on lead 41e.

Like driver 41, driver 51 must not only couple sustain signals to its associated conductor, but must couple selection, i.e. half-select, write and erase signals thereto, as well. In particular, write/erase circuitry in driver 51 for coupling the positive half-select write and erase signals of waveforms (D) and (G) to column conductor C1 includes transistors 51b, 51c and 51d. These transistors are arranged similarly to transistors 41b, 41c and 41d of driver 41. However, the corresponding transistors are of opposite channel conductivity type since driver 51 handles positive, rather than negative, write and erase signals. Thus, transistor 51b is of the n-channel type, and may be a D/MOS transistor similar to transistor 41c. Transistors 51b and 51c are of the p-channel type and like transistor 51a, may be similar in construction to transistor 41a.

Although drivers 41a and 51a are similar to each other, there are some differences in their structure and operation. Assume, for example, that the semiconductor layer in which transistor 51a is disposed (represented by the arrow in the transistor 51a circuit symbol) were maintained at ground potential during the time that positive write and erase signals are applied to column conductor C1 via transistor 51d and lead 51e. In that case diode action, as described above, would occur in transistor 51a, thereby shorting out conductor C1 and shunting the write or erase signal to ground.

In accordance with a feature of the invention, this problem is avoided in driver 51 by raising the potential of that semiconductor layer and thus, illustratively, the source of transistor 51a, at the same time that write and erase signals are applied to the driver. In the illustrative embodiment of FIG. 1, this is accomplished by interconnecting the source of transistor 51a, and column write/erase lead 16 via lead 51f. Thus even when the potential on lead 51e rises in response to a write or erase signal, a zero potential difference is maintained between the drain of transistor 51a, and the semiconductor layer in which it is disposed, and the undesired diode action does not occur.

In addition, it will be remembered that decouple lead 17 was assumed to maintain the gate of transistor 51a at ground potential. As described hereinabove, this ensures that the channel region of transistor 51a will be rendered conductive by the $V_s$ sustain signals applied to its source, thereby extending $V_s$ to conductor C1. Note, however, that with lead 51f in place to preclude undesired diode action, the write and erase signals continuously appearing on lead 16 could forward bias transistor 51a, just as the $V_s$ sustain pulses do, thereby feeding the write and erase signals through to conductor C1 even with no address signal on lead 33. This problem is avoided in accordance with the invention by maintaining a positive potential $V_d$ on decouple lead 17 at least during the times that write and erase signals appear on lead 16, thereby preventing transistor 51a from becoming conductive in response thereto. In fact, it may be convenient to maintain the gate of transistor 51a at this positive potential at all times except when $V_s$ is applied to its source. An appropriate such waveform for decouple lead 17 is shown as waveform (J) in FIG. 2.

Substrate 101 of chip 100 should be connected to a potential at least as negative as the most negative signal potential applied to chip 100. This ensures that the junctions between the various regions of epitaxial layer 102 on the one hand (such as regions 105 and 106), and substrate 101 and isolation diffusions 103 on the other hand, are always reversed biased, thereby maintaining the various regions of layer 102 electrically isolated from one another. The most negative signal potential applied to drivers 41–43 is the half-select write potential on lead 15. This potential may be on the order of −100 volts. The sustain potential $V_s$, periodically applied to the sources of the sustain driver transistors such as transistor 41a, illustratively has a magnitude on the order of +100 volts. Thus if substrate 101 were held at a constant −100 volts, a 200-volt reverse bias would be periodically impressed across the above-mentioned junctions in chip 100. Theoretically, these junctions should be able to withstand such a reverse bias. However, some of the junctions between, for example, regions 105 and 106 of epitaxial layer 102 on the one hand and isolation diffusions 103 on the other hand, are susceptible of breaking down at somewhat lower voltages due, for example, to irregularities in the manufacturing process. As an added precaution, substrate 101 may be connected to write/erase line 15 rather than to a constant −100 volts; line 15 always carries the most negative potential applied to a row driver at any given time.

Now when the $V_s$ sustain signal is applied to the source of transistor 41a, for example, substrate 101 is at ground rather than at −100 volts. Thus a safer 100 volts of reverse bias is impressed across the epitaxial layer-isolation diffusion junctions.

A further advantage of connecting substrate 101 to write/erase line 15 is that write and erase signals can now be "brought up", or "tapped" from isolation diffusions 103 through passivating layer 113 at numerous locations on chip 100. One such "tap" is indicated at 141 in FIG. 3. This advantageously reduces the complexity of the metalization paths to be run along the surface of layer 113 and may, for a given application, obviate a need for expensive crossover and/or crossunder connections.

The most negative signal potential applied to column drivers 51-53 is ground. Thus the substrate of the integrated circuit chip on which those drivers are disposed is illustratively connected to ground; again, only a maximum of 100 volts of reverse bias is impressed across any junction in the chip.

Figure 4:
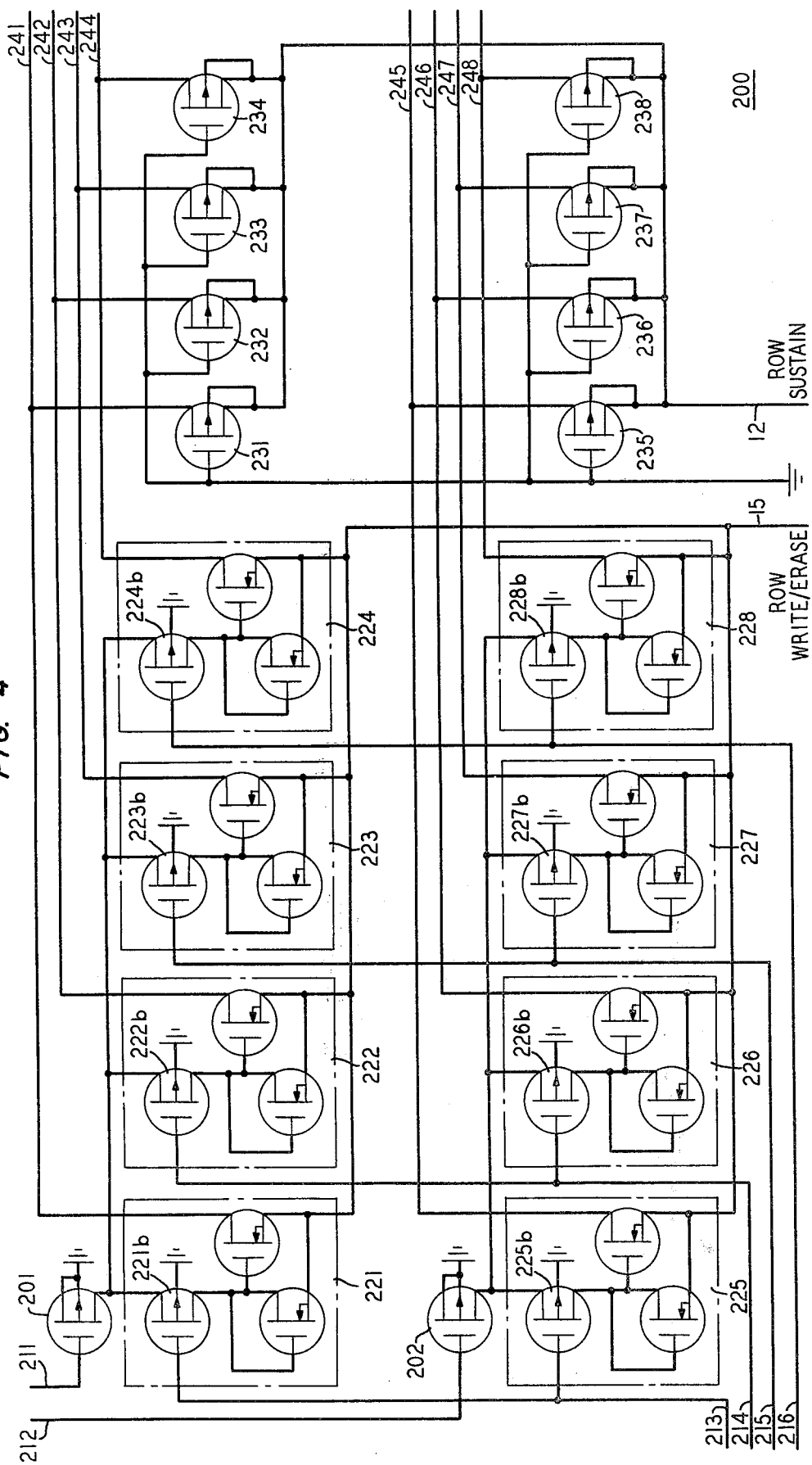
FIG. 4 depicts a decoder/driver circuit embodying the principles of the present invention for driving eight row conductors and further including integral address decoding circuitry.

It will be appreciated that although the present invention has been illustrated in conjunction with a display device having cells arranged in three rows and three columns, the invention can be used in conjunction with a display device having any desired number of rows and columns. FIG. 4 shows a decoder/driver 200 embodying the principles of the present invention, which can drive eight row conductors. Decoder/driver 200 also includes circuitry providing a row address decoding function such as is provided by row address decoder 22 in FIG. 1. Advantageously, the whole of decoder/driver 200 can be fabricated on a single integrated circuit chip.

Circuit 200 has eight output lines 241 through 248 adapted to be connected to eight row conductors of a display device. Row sustain signals are coupled to each of output lines 241-248 via sustain transistors 231-238, respectively. These transistors operate similarly to transistor 41a of driver 41. Thus, the drain of each of transistors 231-238 is connected to the associated output line. The sources of transistors 231-238 are each connected to row sustain lead 112. The gates of these transistors are grounded.

Write and erase signals are coupled to output lines 241-248 via write/erase circuit 221-228, respectively. Each of these circuits is similar to the three-transistor arrangement in driver 41 comprising transistors 41b-41d. For example, these circuits include transistors 221b-228b, respectively, corresponding to transistor 41b of driver 41. Circuits 221-228 each receive write and erase signals from row write/erase lead 15 and each is operative in response to an appropriate address signal for extending those signals through to the associated output line. The way in which an individual one of circuits 221-228 is addressed, however, is somewhat different from the arrangement of FIG. 1.

In particular, the sources of transistors 221b through 224b of circuits 221-224, respectively, are connected in common to the drain of a first pMOS "control" transistor 201. Similarly, the sources of transistors 225b-228b of circuits 225-228, respectively, are connected in common to the drain of a second pMOS control transistor 202. Further, the gates of transistors 221b and 225b are connected in common to an input lead 213. the gates of transistors 222b and 226b are similarly connected in common to an input lead 214. Corresponding connections are made from transistors 223b and 227b to input lead 215 and from transistors 224b and 228b to input lead 216.

Write and erase signals are coupled to a selected one of output lines 241-248 by applying a signal on one of input leads 211 and 212 to forward bias one of transistors 201 and 202 and applying a similar, coincident signal on one of leads 213-216. Thus, for example, a signal on lead 211 grounds the sources of transistors 221b-224b through transistor 201. A coincident signal on lead 214, for example, renders transistor 221b conductive, and the write or erase signal then on lead 215 is coupled through to output line 242. None of the other write/erase circuits is operated, however. For example, the signal on lead 214, which is also applied to transistor 226b, does not operate circuit 226 since control transistor 202 is nonconductive. Circuit 228 is similarly operated by coincident signals on leads 212 and 216, and so forth for each of the six other write/erase circuits. It will be recognized that the group of six leads 211-216 and the signals thereon respectively correspond generally to cable 21 of FIG. 1 and the code words thereon.

Circuitry for driving eight column conductors may be provided by combining eight column drivers, like driver 51, in a similar arrangement.

Figure 5:
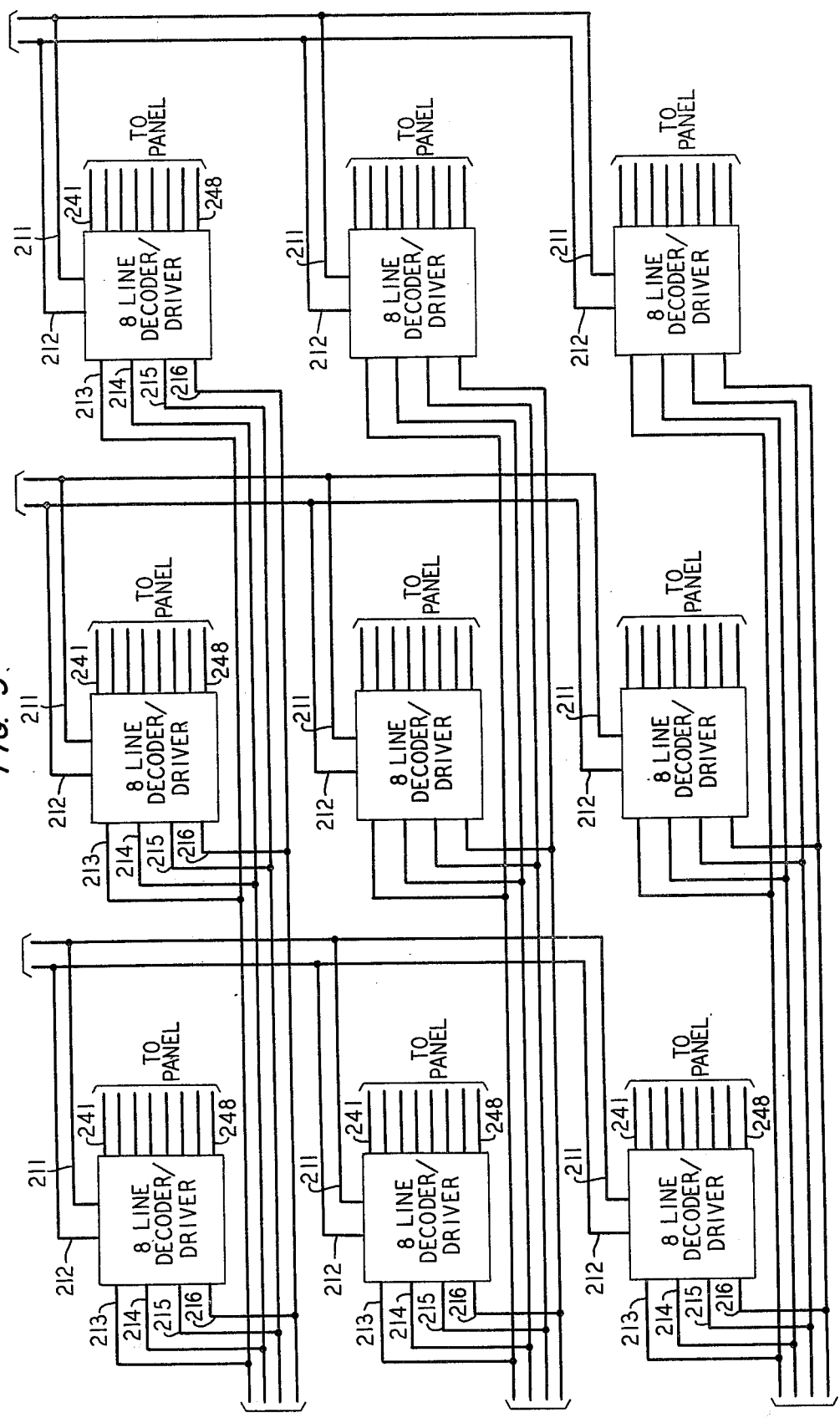
FIG. 5 depicts nine decoder/drivers of the type shown in FIG. 4 interconnected to provide a decoder/driver for 72 row or column conductors.

A plurality of identical row or column decoder/drivers of the type shown in FIG. 4 can be interconnected to drive any desired number of row or column conductors. For example, FIG. 5 shows an interconnection of nine eight-line decoder/driver units, such as decoder driver 200, for driving 72 conductors. The nine decoder/drivers are arranged in a three-by-three matrix. Leads 211 and 212 of each decoder/driver in a given column of the three-by-three matrix are connected to the corresponding leads of each other decoder/driver in that column. Similarly, leads 213-216 of each decoder/driver in a given row of the matrix are each connected to the corresponding leads of each other decoder/driver in that row. A desired one of the 72 output lines of the matrix of FIG. 5 (nine sets of eight lines 241-248) is selected by applying concurrent signals to an appropriate one of the six input leads along the top of the matrix and an appropriate one of the twelve input leads along the left side thereof. This matrix may be extended in obvious fashion to drive additional row or column conductors, as the case may be.

Although specific embodiments of the invention are shown and described herein, these merely illustrate the principles of the invention. Thus, for example, it will be appreciated that the terms "row" and "column" used herein and in the appended claims are arbitrary designations and, as such, are interchangeable. In fact, the invention could even be implemented in a display device utilizing a polar coordinate system in which the "rows" are radial lines of cells and the "columns" are concentric circles thereof.

Furthermore, although p- and n-channel transistors are utilized in various capacities in the present driver circuits, arrangements employing the opposite type transistors may be devised within the teachings of the invention. Moreover, it is to be understood that the specific sustain, write and erase waveforms disclosed herein are merely exemplary and that the present driver circuits can be used with any of a variety of signal waveforms.

Thus it will be appreciated that many and varied arrangements embodying the principles of the present invention may be devised by those skilled in the art without departing from the spirit and scope thereof.

What is claimed is:

1. Driver circuitry for extending signals to first and second coordinate conductors associated with a predetermined cell of a matrix display device comprising
first and second MOS transistors each comprised of a first conductivity type semiconductor layer and second conductivity type drain and source regions disposed in said layer and defining a channel region therein,
means for connecting the drain regions of said first and second transistors to said first and second conductors, respectively, and
means for concurrently coupling respective signals at first and second potentials to the source region of said first transistor and the semiconductor layer of said second transistor, respectively, and for thereafter concurrently coupling said signals to the source region of said second transistor and the semiconductor layer of said first transistor, respectively.

2. The invention of claim 1 further comprising means for interconnecting the source of each transistor and its semiconductor layer, and biasing means for rendering the channel region of each transistor conductive when said signal at said first potential is applied to the source region thereof.

3. The invention of claim 2 further comprising means for selectively coupling first and second polarity selection signals to said first and second conductors, respectively, and means for applying said first polarity selection signals to the source region of said first transistor.

4. A driver for extending signals to a conductor defining one coordinate of a matrix display cell comprising
a first MOS transistor disposed in a semiconductor layer, means for connecting the drain of said transistor to said conductor, first means for coupling sustain signals concurrently to the source of said transistor and said layer, second means operative for coupling write and erase signals to said conductor, and third means operative at least during the operation of said second means for coupling said write and erase signals to said layer.

5. The invention of claim 4 further comprising biasing means for establishing the gate of said transistor alternately at a first potential such that its channel is rendered conductive when said sustain signals are at a predetermined level and at a second potential such that said channel is maintained nonconductive during the operation of said third means.

6. The invention of claim 5 wherein said second means includes second and third MOS transistors of a first channel conductivity type and a fourth MOS transistor of a second channel conductivity type, means for applying said write and erase signals to the cources of said second and third transistors, means for connecting the gates of said second and third transistors to the drains of said third and fourth transistors and to each other, means for connecting the source of said fourth transistor to a reference potential, and means responsive to an address signal for rendering the channel of said fourth transistor conductive.

7. A display system comprising,
a display device having an array of crosspoint cells defined by respective row and column conductors,
a plurality of individual row and column drivers each including an MOS sustain transistor having first conductivity type drain and source regions disposed in a second conductivity type semiconductor layer and defining a channel region therein, means for maintaining the source region of each sustain transistor at substantially the same potential as the semiconductor layer thereof,
means for connecting the drain of each row driver sustain transistor to an associated one of said row conductors,
means for connecting the drain of each column driver sustain transistor to an associated one of said column conductors, and
means for establishing an alternating-polarity potential difference of predetermined magnitude between the source regions of said row driver sustain transistors, on the one hand, and the source regions of said column driver sustain transistors, on the other hand,
each of said row drivers further including biasing means for rendering the channel region of its sustain transistor conductive in response to one polarity of said potential difference, and each of said column drivers further including biasing means for rendering the channel region of its sustain transistor conductive in response to the other polarity of said potential difference.

8. The invention of claim 7 wherein each of said row drivers further includes circuit means operative for coupling row selection signals of a first polarity to its associated conductor, wherein each of said column drivers further includes circuit means operative for coupling column selection signals of a second polarity to its associated conductor and to the source of its sustain transistor, and wherein the biasing means of each column driver includes means for varying the gate potential of its sustain transistor to maintain the channel region of that sustain transistor nonconductive when said column selection signals are coupled to the source thereof.

9. The invention of claim 8 wherein the circuit means of each of said row and column drivers includes second, third and fourth MOS transistors, means for connecting the gates of said second and third transistors to the drains of said third and fourth transistors and to each other, means for connecting the source of said fourth transistor to a reference potential, and addressing means operative for rendering the channel region of said fourth transistor conductive, the second and third transistors of each row driver circuit means and the fourth transistor of each column driver circuit means being of a first channel conductivity type, and the second and third transistors of each column driver circuit means and the fourth transistor of each row driver circuit means being of a second channel conductivity type, said display system further comprising means for applying said row and column selection signals to the sources of the second and third transistors of said row driver circuit means and column driver circuit means, respectively.

10. The invention of claim 9 wherein said reference potential connecting mens includes a plurality of control MOS transistor each having its drain connected to the sources of a different plurality of said fourth transistors, means for connecting the sources of said control transistors to said reference potential, and means individually operative for rendering the channel regions of respective one of said control transistors conductive.

* * * * *